(12) United States Patent
Kinbara

(10) Patent No.: US 6,259,714 B1
(45) Date of Patent: *Jul. 10, 2001

(54) POWER SOURCE CONTROL APPARATUS FOR LASER DIODE

(75) Inventor: Yoshihide Kinbara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/146,360

(22) Filed: Sep. 3, 1998

(30) Foreign Application Priority Data

Sep. 9, 1997 (JP) .................................................. 9-243836

(51) Int. Cl.[7] .................................. H01S 3/00; H01S 3/30
(52) U.S. Cl. ..................................... 372/38.02; 372/38.01; 372/38.07; 372/38.09; 372/8
(58) Field of Search .............................. 372/38.01, 38.02, 372/38.07, 38.09, 8, 704, 705

(56) References Cited

U.S. PATENT DOCUMENTS

| | | | |
|---|---|---|---|
| 4,400,812 | * | 8/1983 | Clark et al. ............................. 307/252 |
| 4,491,742 | * | 1/1985 | Akamatsu ............................. 307/252 |
| 5,068,862 | * | 11/1991 | Zimmermann et al. .............. 323/282 |
| 5,291,505 | | 3/1994 | Nielsen . |
| 5,374,798 | * | 12/1994 | Kinbara ................................ 323/282 |
| 5,666,045 | * | 9/1997 | Grodevant ............................. 323/282 |
| 5,801,375 | * | 9/1998 | Sasaki et al. .......................... 250/216 |

FOREIGN PATENT DOCUMENTS

| | | |
|---|---|---|
| 0096341 | 12/1983 | (EP) . |
| 0716485 | 6/1996 | (EP) . |
| 4-61389 | 2/1992 | (JP) . |
| 7-211970 | 8/1995 | (JP) . |

OTHER PUBLICATIONS

Allan Greenwood, electrical Transients in Power Systems, second edition, pp. 100 and 173, 1991.*

* cited by examiner

Primary Examiner—Robert H. Kim
Assistant Examiner—Armando Rodriguez
(74) Attorney, Agent, or Firm—Sughrue, Mion, Zinn, Macpeak & Seas, PLLC

(57) ABSTRACT

A power source control apparatus has a constant current circuit and plural laser diodes. A first switching circuit is turned off, while a second switching element is turned on, before a laser beam is output from the laser diodes. Then, there is formed a circulating circuit for supplying electricity to a current controlling switching element and a reactor. At this time, a fixed constant current is supplied to the reactor, while kept at a command value. When a laser output command signal is generated, the first switching element is turned on, while the second switching element is turned off. Then, there is formed a circuit for supplying electricity to the current controlling switching element, reactor and laser diodes. At this time, influence of inductance of the reactor can be ignored. Thus, a constant current pulse with a steep rise and fall is supplied to the laser diodes.

10 Claims, 11 Drawing Sheets

Drive Signal
(ST)

Output Current
from Power Source

Laser Output
Command Signal
(PO)

Laser Diode
Input Current

Electric Potential
of Output Terminal DA

Output Drive Signal (PL)

Laser Diode Input Current (I)

Laser Diode Applied Voltage (V)

POWER SOURCE CONTROL APPARATUS FOR LASER DIODE

BACKGROUND OF THE INVENTION

1. Field of the Invention

This invention relates to a power source control apparatus for controlling a current supply to a laser diode in a semiconductor laser. The semiconductor laser oscillates laser by supplying current to a p-n junction.

2. Description of Related Art

FIG. 10 shows an overall circuit of a conventional power source control apparatus for laser diodes.

Referring to FIG. 10, a power source 1 is composed of a constant voltage source like a D.C. power source and so on. A current control switching element 2 is connected to the power source 1 so as to perform a switching operation by an external signal, i.e. an output command signal PL. The power source 1 is connected to a series circuit of the switching element 2 and a reverse-biased diode 3. A reactor 4 is connected to a junction point "a", where the switching element 2 and the diode 3 are connected in series with each other. The other terminal of the reactor 4 is connected at a junction point "b" to an anode side of laser diodes LD1–LDn, which are connected in series. On the other hand, a cathode side of the laser diodes LD1–LDn is connected at a junction point "c" to a junction point between the power source 1 and the diode 3. Power is supplied to the laser diodes LD1–LDn by switching control of the switching element 2 through the reactor 4.

The laser diodes LD1–LDn respectively emit laser beams to a solid state laser medium or rod 5. Such laser beams are excited and oscillated between a reflecting mirror 7 (100% reflectance) and a semi-transparent mirror 6, so that a laser beam 8 goes out from the semi-transparent mirror 6. In order to supply current to the laser diodes LD1–LDn, a current detector 9 detects a current of the reactor 4. Then, an output of the detector 9 is fed back to an error comparator 10 and compared with a command value ITH of a commander 11. The switching element 2 performs switching control according to a comparison result so as to feed a current of an equal value to the command value ITH. The command value signal ITH is turned on and off by an analog gate 12, which is operated by an output drive signal PL. Consequently, the current supplied to the laser diodes LD1–LDn is on-off controlled so that a constant current set as the command value ITH is supplied to the laser diodes LD1–LDn.

FIGS. 11a–11c show waveforms and a time chart explaining an operation of the control apparatus of FIG. 10.

FIG. 11a shows a waveform of the drive signal PL for turning on and off the analog gate 10. FIG. 11b shows a waveform of a laser diode input current I that is a current supplied to the laser diodes LD1–LDn. FIG. 11c is a waveform of a laser diode applied voltage V that is a voltage applied to the laser diodes LD1–LDn.

When the signal PL becomes on at a timing T1, the switching element 2 turns on. Then, the current I increases at a fixed time constant by an inductance of the reactor 4. When the current I of the reactor 4 reaches the command value ITH at a timing T2, the switching element 2 is on-off controlled to keep the current I at such constant value. At this time, the output of the detector 9 is input into the comparator 10 and compared with the command value ITH, so that the current of the same value as the command value ITH is supplied by the switching control. When the signal PL is switched off at a timing T3, the switching element 2 turns off. Then, the current I of the reactor 4 begins decreasing at a fixed time constant. Since the reactor 4 stores energy, which is decided by the inductance and the current value, the current I is not turned off until a timing T4. The inductance of the reactor 4 stores the energy between the timings T1 and T2 when the current I increases. Therefore, in case the inductance is large, it takes a long time. Especially, when a short width pulse is output between the timings T5–T6, the current I cannot be a rectangular wave as shown by the output current waveform Ill between the timings T5–T7.

Namely, the conventional control apparatus cannot supply an input current of rectangular wave to the laser diodes LD1–LDn in response to a short width pulse. Thus, the output current has a slow response speed, and it is impossible to output a correct pulse current waveform.

BRIEF SUMMARY OF THE INVENTION

An object of the present invention is to provide a power source control apparatus for a laser diode that has a rapid responsibility in supplying current to a laser diode.

According to a first aspect of the invention, a power source control apparatus for a laser diode comprises a laser diode. A constant current source is connected to the laser diode. A current switching circuit forms a circulating circuit to circulate a current output from the constant current source when a laser output command signal for making the laser diode output a laser beam is off. The current switching circuit forms a circuit to supply power from the constant power source to the laser diode from the constant power source when the laser output command signal is on.

The current switching circuit may include a first switching element connected in parallel with the laser diode and a second switching element connected in parallel with the laser diode. The current switching circuit turns on the first switching element while turning off the second switching element when the laser output command signal is off, thereby circulating a current from the constant current source within the current switching circuit through the first switching element. The current switching circuit turning on the second switching element while turning off the first switching element when the laser output command signal is on, thereby outputting the current from the constant current source to the laser diode through the second switching element.

The current switching circuit may include a switching element connected in parallel with the laser diode. The current switching circuit turns on the switching element when the laser output command signal is off, thereby circulating a current from the constant current source within the current switching circuit through the switching element. The current switching circuit turns off the switching element when the laser output command signal is on, thereby outputting the current from the constant current source to the laser diode.

With such features, current change (di/dt) of the current output from the constant current source can be substantially ignored, so that influence due to inductance contained in the constant current source can be ignored, too. Thus, constant current pulses can be supplied with steep rise and fall according to a capacity of the current switching circuit. Consequently, the current supplied to the laser diode has a rapid response.

The constant current source may comprise a reactor connected in series with the laser diode. A current controlling switching element may be further connected in series with the laser diode and the reactor. The current controlling switching element performs on-off control so as to supply a constant current to the laser diode. A power source may be further provided to supply the power to the laser diode via the current controlling switching element and the reactor connected in series. The current switching circuit as the circulating circuit supplies current to the current controlling switching element and the reactor.

With such features, current change (di/dt) flowing in the reactor can be substantially ignored, so that influence due to inductance thereof can be ignored, too. Thus, constant current pulses can be supplied with steep rise and fall according to a capacity of the current switching circuit. Consequently, the current supplied to the laser diode has a rapid response.

The current controlling switching element may be turned on in advance when the laser output command signal is off so that the current value of the reactor becomes equal to a command value. The laser output command signal is turned on and off thereafter. The current controlling switching element is turned off after the laser output command signal is turned off.

With such features, the constant current supplied to the laser diode has its rise and fall very steep. It is possible to obtain constant current pulses with high responsibility in response to the laser output command signal. Consequently, laser output can be get from the laser diode at a correct timing.

One or both of a reverse-biased diode and a resistor may be connected in parallel with the laser diode. With such features, the constant current supplied to the laser diode has very steep rise and fall. Thus, it is prevented that reverse voltage is applied due to oscillating current generated by self-inductance of lead wires in the circuit, capacity of the current switching circuit or laser diode, stray capacity between the lead wires and so on. Consequently, the circuit is very hard to be damaged.

Moreover, a plurality of laser diodes may be connected in series. Then, one or both of the diode and resistor is connected in parallel with each laser diode. The resistors have the same resistance. In this case, the resistors balance voltages between the laser diodes at an off time by dividing the voltages by the same resistance. Consequently, it is prevented that voltage concentrates on a certain laser diode. Moreover, the resistor acts to prevent oscillation of the oscillating current.

A reverse-biased diode may be connected in parallel with the laser diode at a position near the laser diode. A series circuit is connected in parallel with the reverse-biased diode. The series circuit includes a resistor and a capacitor.

With such features, the reverse-biased diode prevents a reverse voltage applied to the laser diode when the current is cut off at the laser diode. Moreover, the series circuit prevents a positive voltage rise when a current flowing through the reverse-biased diode is cut off. Consequently, it is possible to safely drive the laser diode that is easy to be broken by the reverse voltage.

A power source voltage of the constant current source may be approximately twice as large as a total value of the forward voltage drop of the laser diode. With such feature, the current increase and decrease in the constant current source become substantially the same when turning on and off the power. Thus, an average of the current flowing in the constant current source and laser diode becomes the same. For example, the current increase and decrease at the reactor become substantially the same when turning on and off the current controlling switching element. Thus, an average of the current flowing through the current controlling switching element and laser diode becomes the same. Consequently, the current is averaged, and a high output power source can be fabricated at low costs as a whole.

A solid state laser medium may be excited by the laser beam output from the laser diode thereby to generate a laser beam. With such feature, the output current waveform is not affected by a d.c. current change. Thus, it is possible to supply sufficiently stable pulse current to the laser diode even if the voltage varies, even with the source voltage obtained by just rectifying a commercial a.c. current. Then, the output laser excites the solid state laser medium such as YAG laser rod thereby to oscillate the laser. Consequently, the laser beam can be output at high efficiency. Moreover, it is possible to produce the laser beam that is pulsed by the pulse current having rapid response. Such laser beam has good property for laser machining.

Further objects and advantages of the invention will be apparent from the following description, reference being had to the accompanying drawings, wherein preferred embodiments of the invention are clearly shown.

BRIEF DESCRIPTION OF THE SEVERAL VIEW OF THE DRAWINGS

Figure 5:
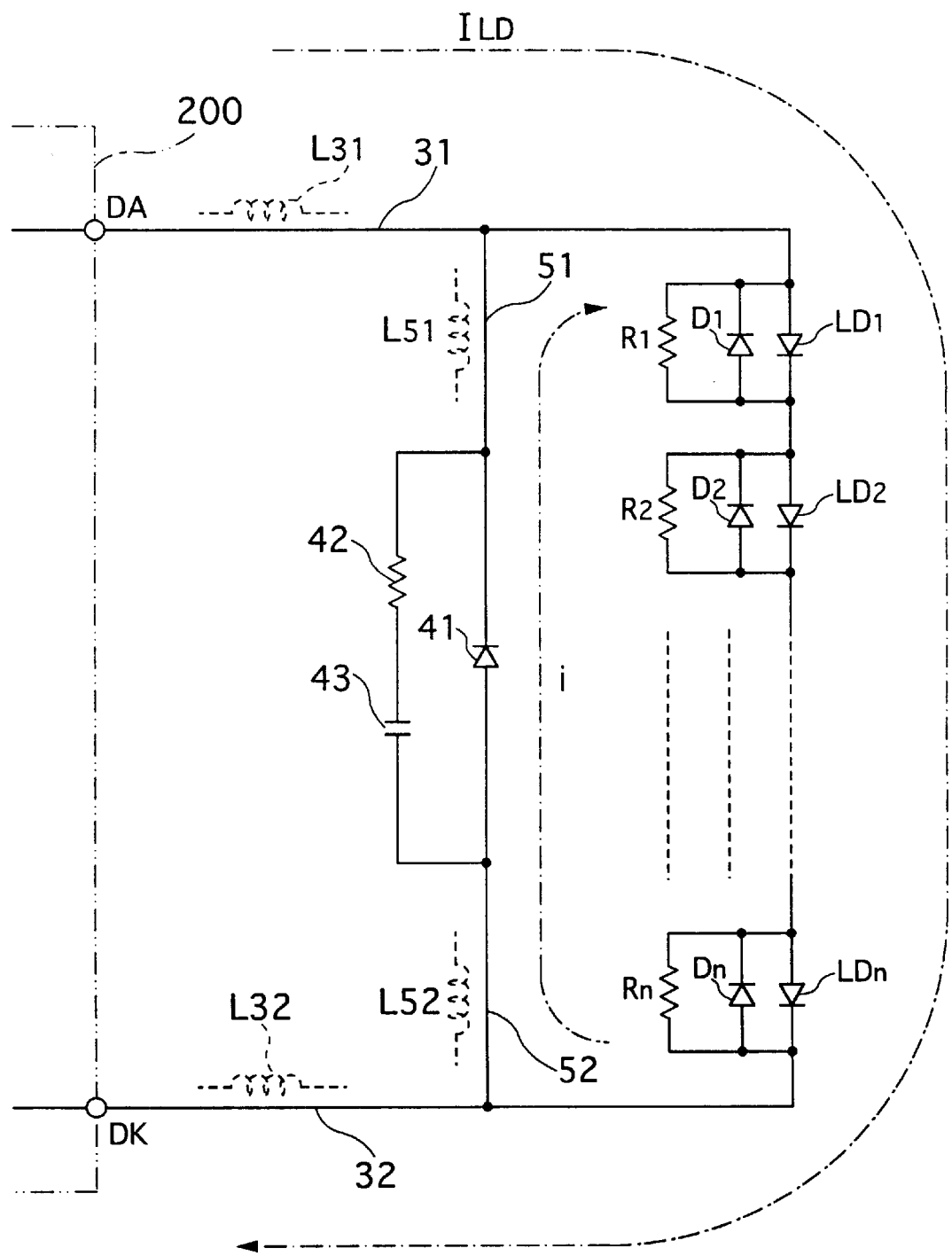

FIG. 5 a circuit diagram showing a circuit at a laser diode side of a power source control apparatus according to a second embodiment of the invention.

Figure 6:
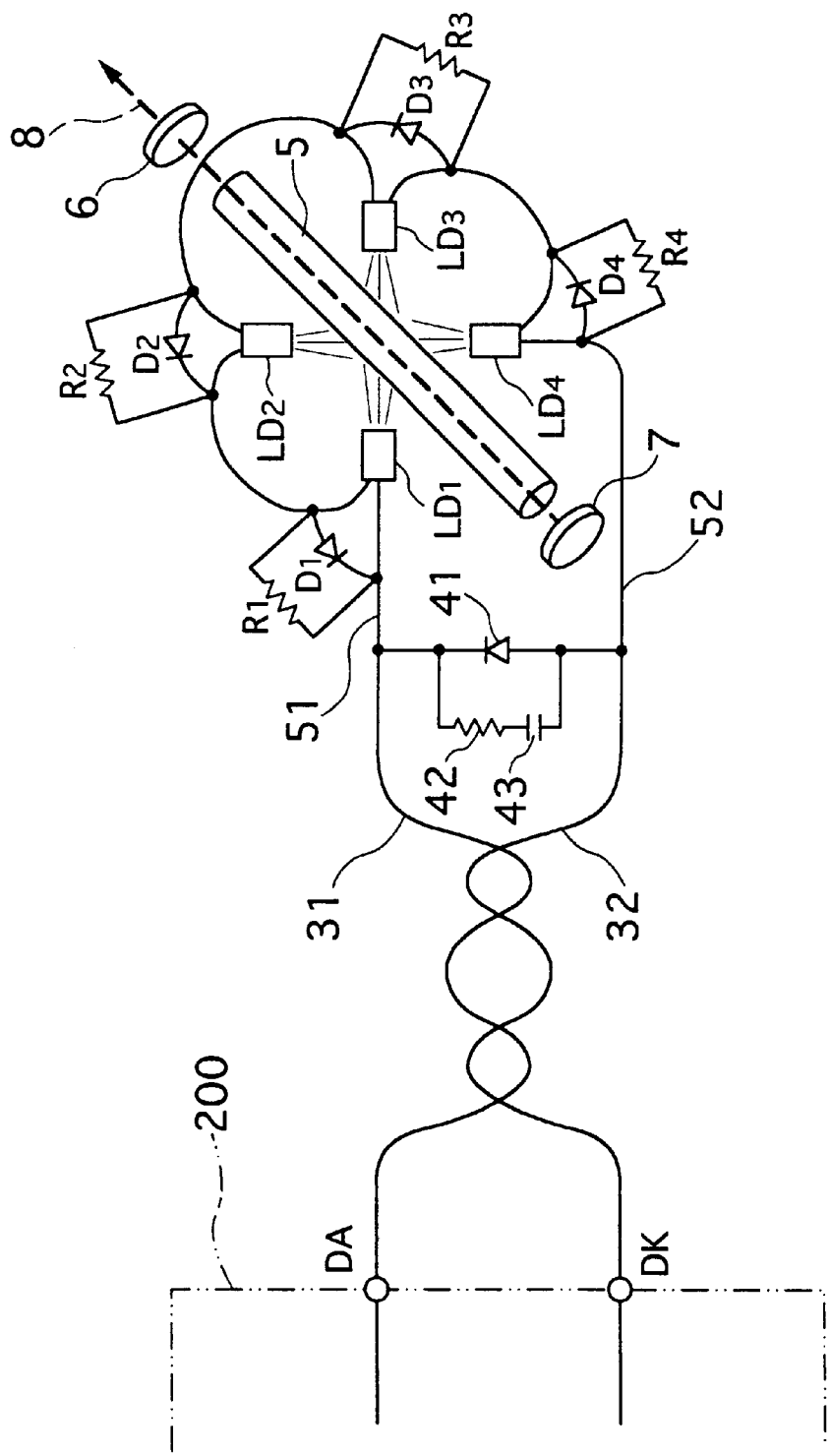

FIG. 6 is a concept view showing a circuit at the laser diode side in the second embodiment of the invention.

Figure 7:
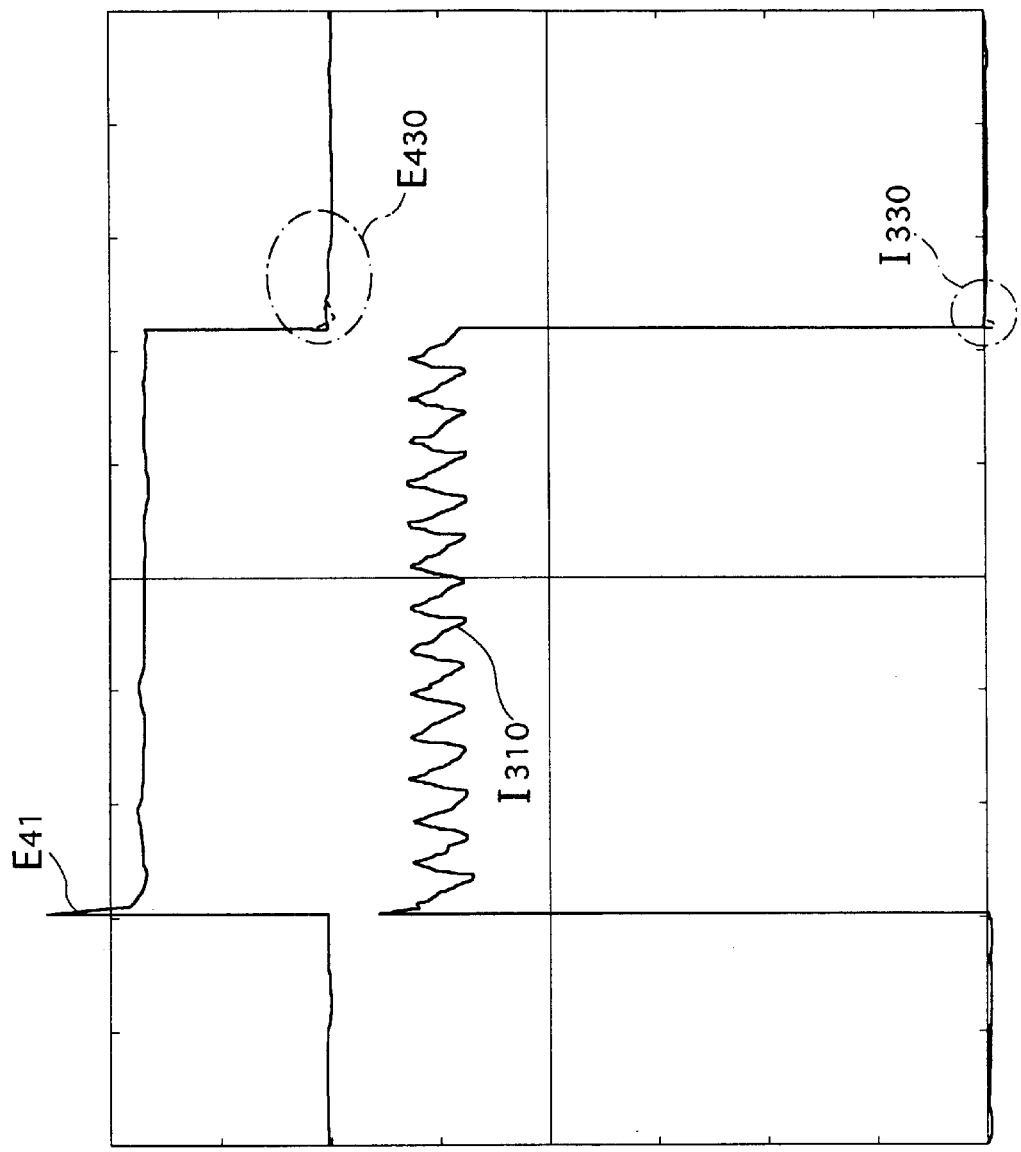

FIGS. 7a and 7b show an actual current waveform supplied to the laser diodes in the second embodiment of the invention.

Figure 8:
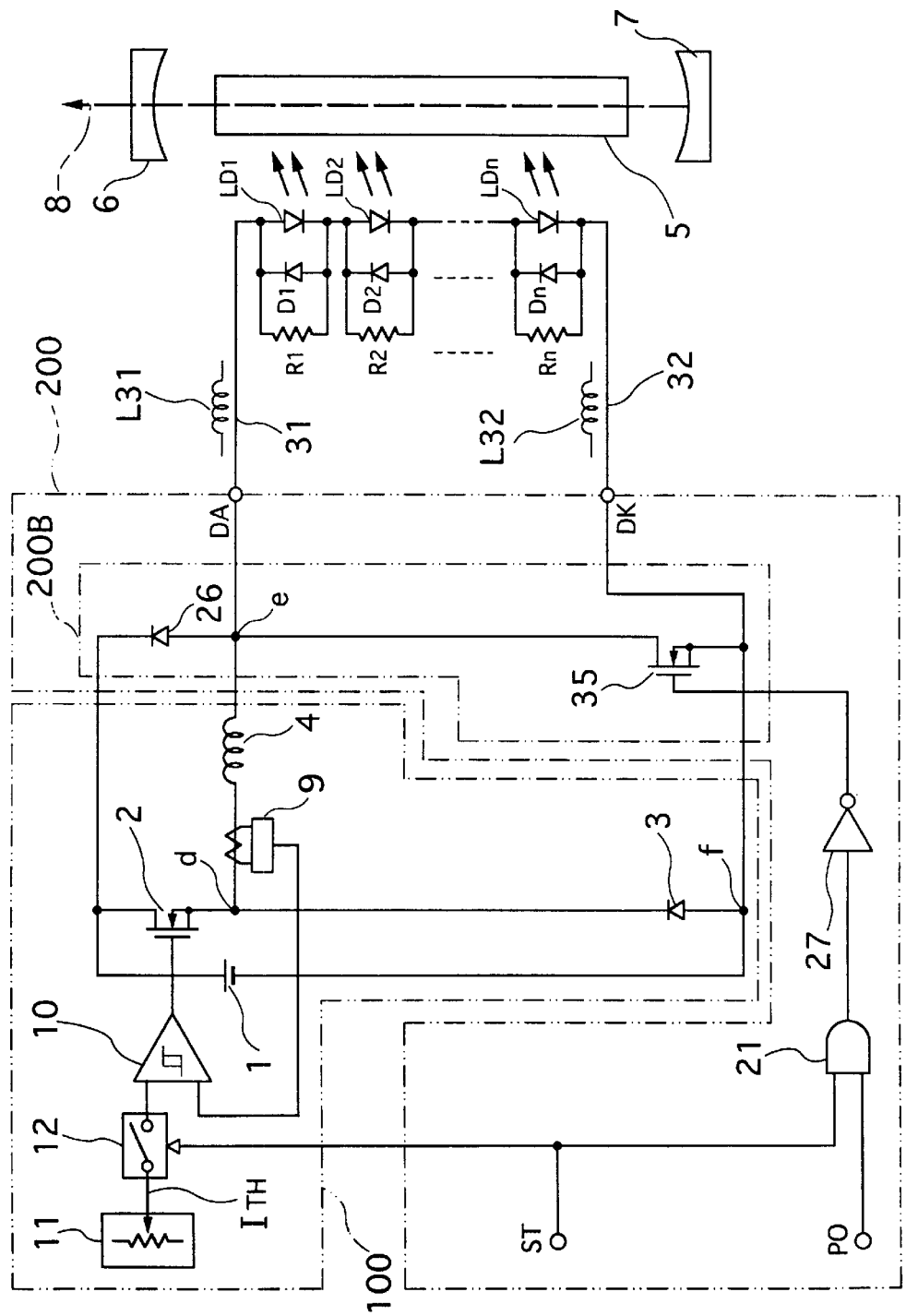

FIG. 8 is a circuit diagram showing an overall circuit of a power source control apparatus according to a third embodiment of the invention.

FIG. 9 shows a time chart and waveforms to explain an operation of the control apparatus of the third embodiment of the invention.

Figure 10:
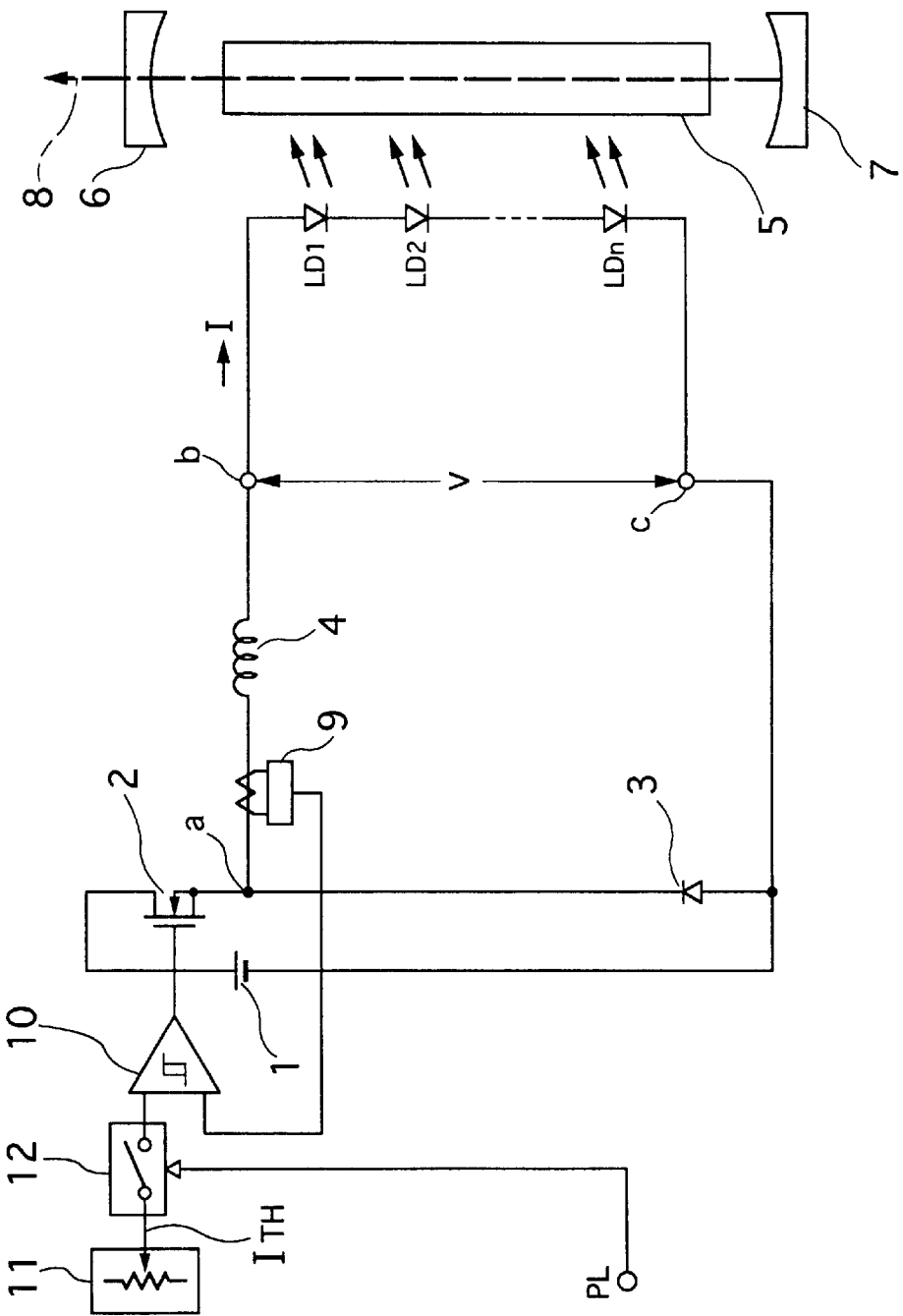

FIG. 10 is a circuit diagram showing an overall circuit of a conventional power source control apparatus for laser diodes.

Figure 11A:
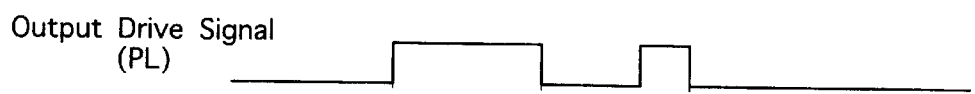
Figure 11B:
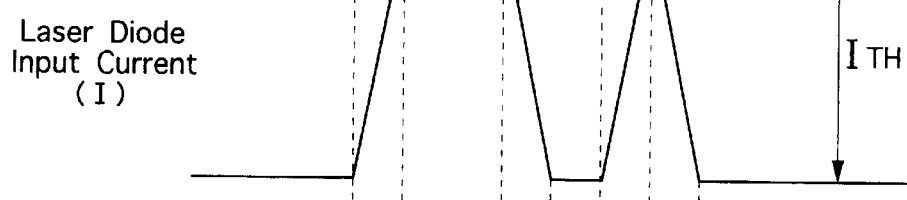
Figure 11C:
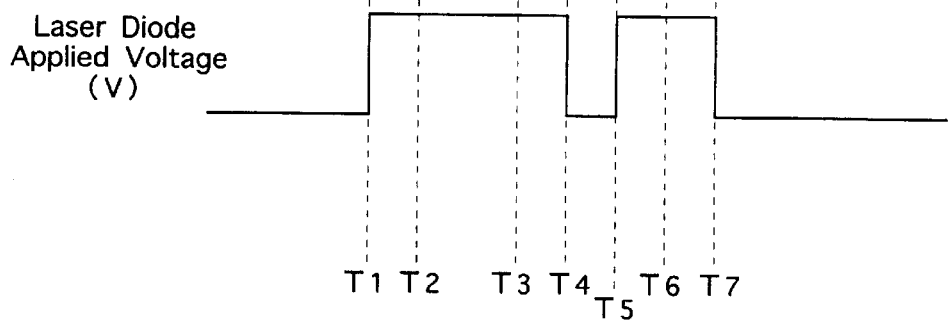

FIGS. 11a–11c show waveforms and a time chart explaining an operation of the control apparatus of FIG. 10.

DETAILED DESCRIPTION OF THE INVENTION

Several embodiments of the invention are described hereunder referring to the attached drawings. The same reference character is attached to the same element as the conventional one shown in FIGS. 10 and 11a–11c . Moreover, the same reference character is used to show the same element throughout the several embodiments.

Figure 1:
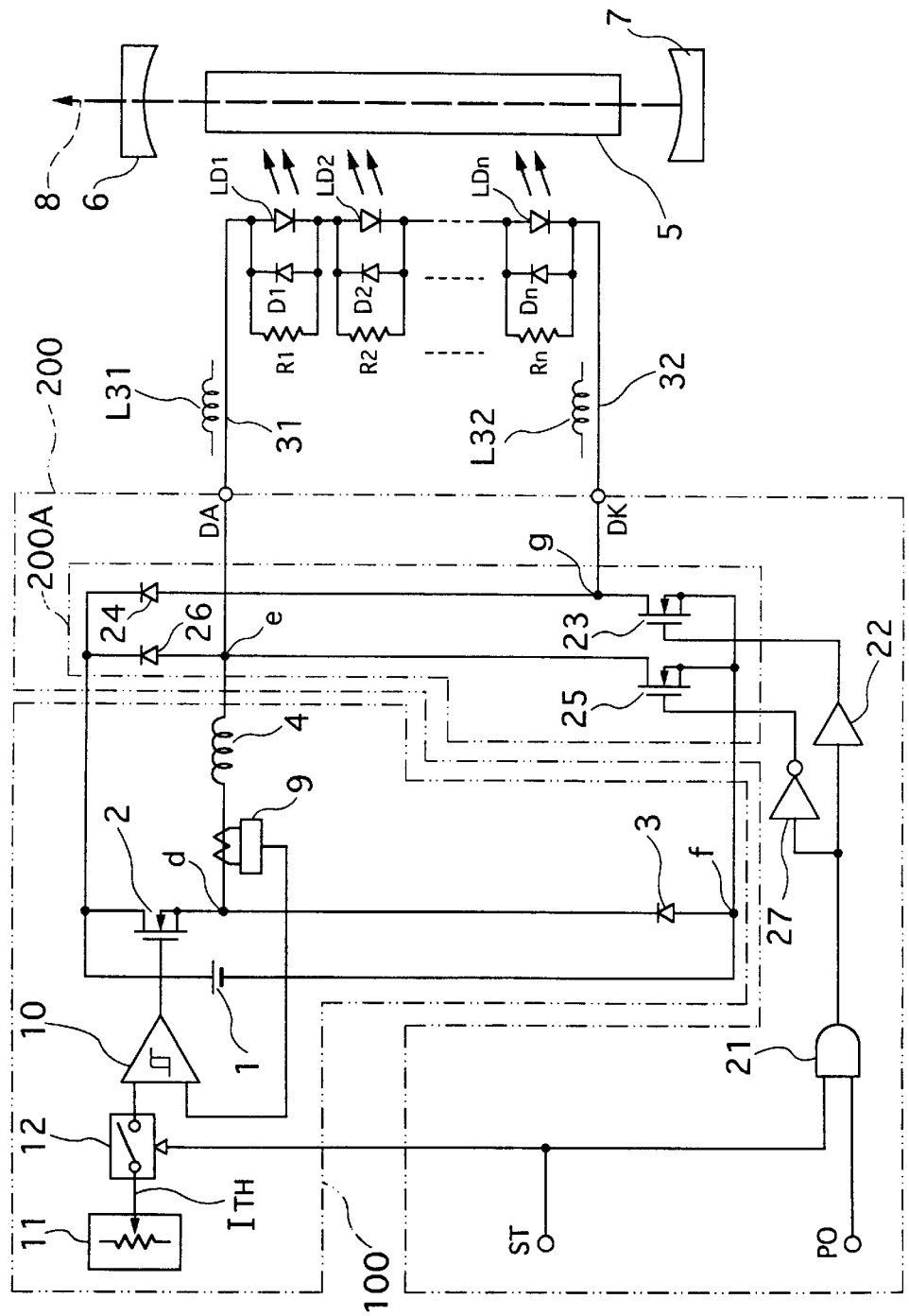
FIG. 1 is a circuit diagram showing an overall circuit of a power source control apparatus for laser diode according to a first embodiment of the invention.
Figure 2:
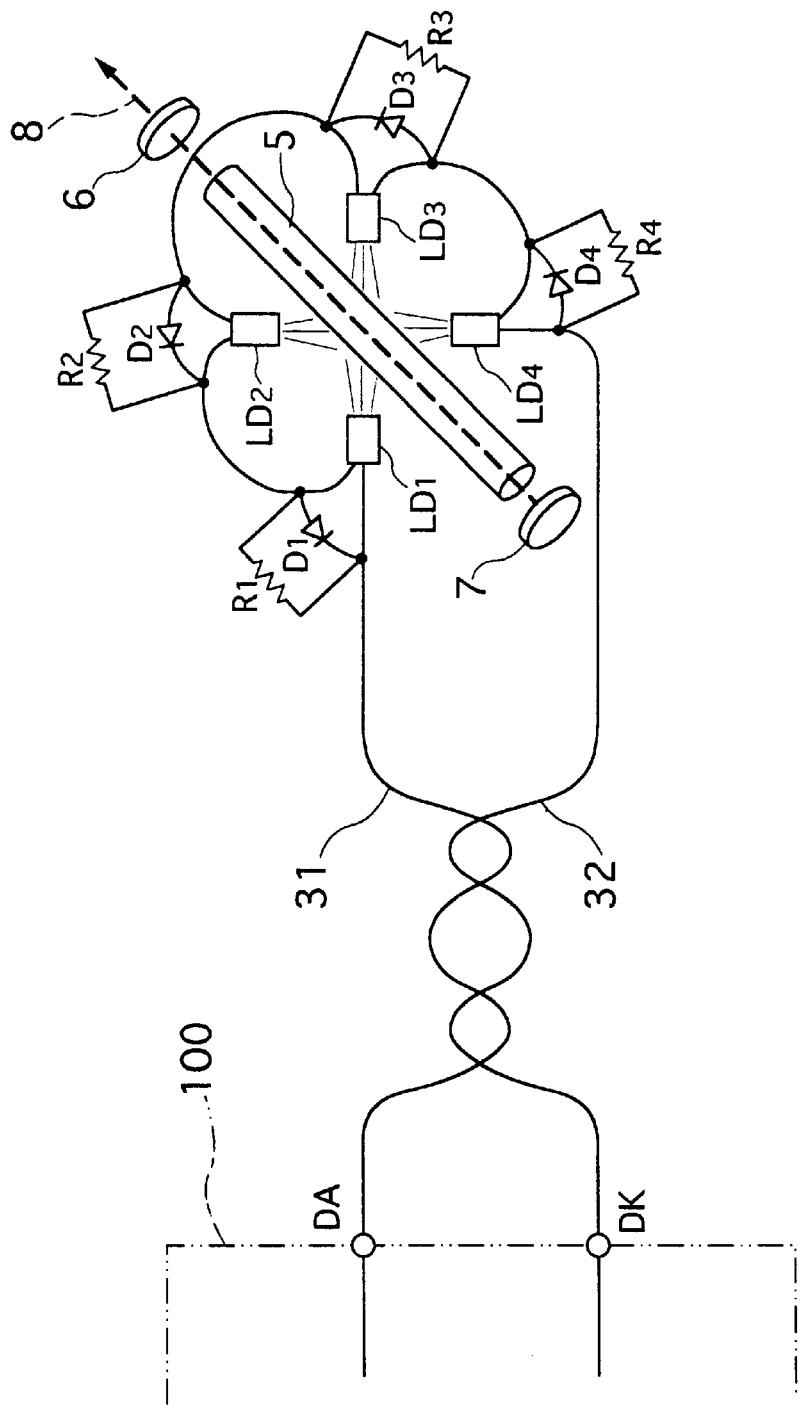
FIG. 2 is a concept view showing a circuit at a laser diode side of the control apparatus of FIG. 1.

FIG. 1 illustrates an overall circuit of a power source control apparatus for laser diode according to a first embodiment of the invention. FIG. 2 shows a concept view of a circuit at a laser diode side of the control apparatus of FIG. 1, in which four laser diodes are used.

Referring to FIG. 1, the current controlling switching element 2 may be MOSFET or the like. The switching element 2 is connected to a positive side of the power source 1 and performs a switching operation by an external drive signal ST. The diode 3 acts as a flywheel for a below mentioned circuit which includes the reactor 4 and the laser diodes LD1~LDn and so on. It may have a single laser diode or plural laser diodes connected in series. A terminal of the reactor 4 is connected to a junction point "d" between the switching element 2 and the diode 3. The other terminal of the reactor 4 is connected with a cathode side of the laser diodes LD1~LDn at a junction point "e". An output terminal DA is defined by a junction point between the reactor 4 and the anode of the laser diodes LD1~LDn. The cathode side of the laser diodes LD1~LDn is connected with a first switching element 23 described later at a junction point "g", which leads to a junction point "f" between the power source 1 and diode 3. Lead wires 31 and 32 connects the anode and cathode of the laser diodes LD1–LDn with the junction points "e" and "g", respectively, at output terminals DA and DK.

In order to supply current to the laser diodes LD1–LDn, the current detector 9 detects the current of the reactor 4. Then, the switching element 2 performs switching control on the basis of the output from the comparator 10, in a similar manner to the conventional art mentioned before. Thus, the supplied current has an equal value to the command value ITH. In the present embodiment, the analog gate 12 for turning on and off the command value signal ITH is operated by a drive signal ST. Namely, the analog gate 12 is on-off controlled by the drive signal ST which governs start and stop of the laser beam 8.

The drive signal ST is output with duration that is calculated as a sum of a time decided by a time constant of the reactor 4 so as to contain a time of a laser output command signal PO. The signal PO defines a signal for outputting the laser beam 8 from the laser diodes LD1~LDn. As shown in FIG. 3a–3f, it takes a time corresponding to a rising waveform I21 or from a timing t1 to a timing t10, for the current flowing through the reactor 4 to finish rising. Therefore, the command signal PO should be turned on and off only within a time period P. Namely, the drive signal ST needs to be turned on before the timing T1. In other words, the drive signals ST may be generated successively by a repetitive pulse frequency of fixed pulse width when the power is switched on. Otherwise, a drive signal ST of fixed pulse width may rise before the rise of the signal PO by delaying the signal PO. Anyway, other modifications are possible as long as the reactor 4 is fed with a current of the command value ITH or its approximate value by the drive signal ST before the command signal PO or its rise. In addition, the drive signal ST must end after a fall of the command signal PO.

An AND circuit 21 provides a logical product of the command signal PO and the drive signal ST so as to drive on and off a first switching element 23, which is composed of MOSFET or the like, through a driver 22. At the same time, an inversion driver 27 inverts the output of the AND circuit 21 so as to drive on and off a second switching element 25. That is, when the drive signal ST and the command signal PO are on, one of the first and second switching elements 23 and 25 is turned on by the output of the AND circuit 21, while the other is turned off. The second switching element 25 is connected between the connecting point "f" and the connecting point "e". The first switching element 23 is connected between the connecting point "f" and the connecting point "g". A diode 26 is reversely connected between the positive side of the power source 1 and the connection point "e". A diode 24 is reversely connected between the positive side of the power source 1 and the connecting point "g", too.

In the present embodiment, a current switching circuit 200 is composed of the AND circuit 21, driver 22, inversion driver 27, second switching element 25, diode 26, first switching element 23 and diode 24. Especially, the second switching element 25, diode 26, first switching element 23 and diode 24 constitute a switching part 200A.

A constant current source 100 is composed of the commander 11, analog gate 12, error comparator 10, current controlling switching element 2, diode 3, reactor 4 and current detector 9. The current source 100 generates constant current by the switching operation.

The output of the power source 100 lead to the output terminals DA and DK via the switching part 200A. Usually, as shown in FIG.2, the lead wires 31 and 32 connect the output terminals DA and DK with the anode and cathode of the laser diodes LD1–LDn (LD1–LD4 in FIG. 2), respectively. The lead wires 31 and 32 have their own self-inductances L31 and L32.

As shown in FIG.1 and FIG.2, reverse-biased diodes D1~Dn and resistors R1~Rn are connected parallel to the laser diodes LD1~LDn.

The laser diodes LD1–LDn in themselves function in the same manner as the conventional art. It is preferable to decide the number of the laser diodes LD1–LDn depending on a desired laser output. A pair of reverse-biased diode D1–Dn and resistor R1–Rn may be connected in parallel with each of the laser diodes LD1–LDn. Otherwise, one of the reverse-biased diode D1–Dn and resistor R1–Rn may be connected in parallel with each of the laser diode LD1–LDn, though not shown. Such reverse diodes D1–Dn and resistors R1–Rn serve to absorb a reverse voltage. Therefore, the diode D1–Dn or the resistor R1–Rn can be used alone depending on a quantity of back electromotive force.

FIGS. 3a–3f show a time chart and waveforms to explain an operation of the control apparatus according to the first embodiment of the invention.

Figure 3:
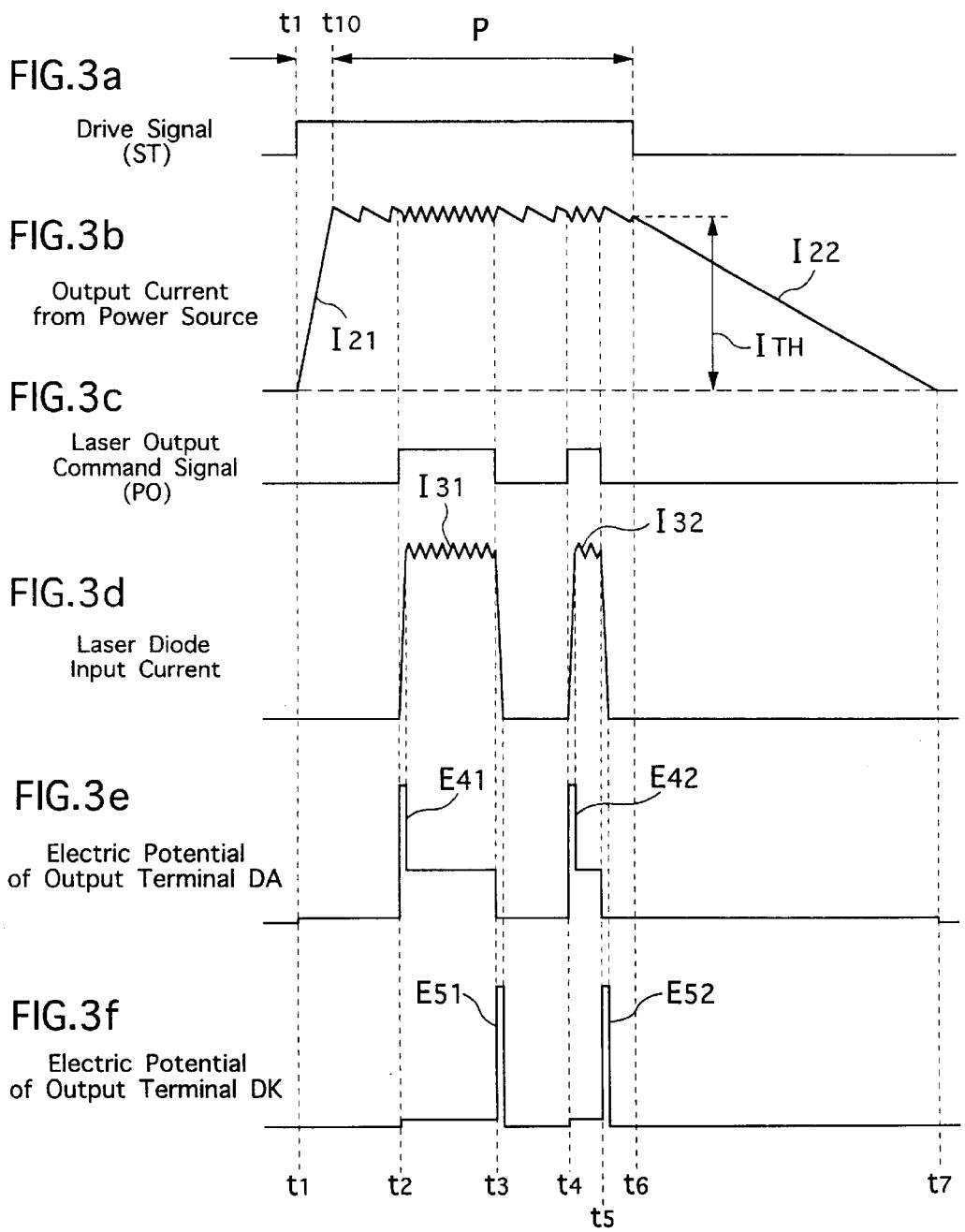
FIGS. 3a–3f shows a time chart and waveforms to explain an operation of the control apparatus according to the first embodiment of the invention.

FIG. 3a shows a waveform of the drive signal ST. FIG. 3b shows a waveform of an output current from the power source. FIG. 3c shows a waveform of the command signal PO. FIG. 3d shows a waveform of a current supplied to the laser diodes LD1–LDn. FIG. 3e shows a waveform of an electric potential of the negative side of the power source and the terminal DA. FIG. 3f shows a waveform of the electric potential of the negative side of the power source and the terminal DK.

The drive signal ST shown in FIG. 3a turns on ("H") at a timing t1 and off ("L") at a timing t6. When there is no laser output, the command signal PO is off ("L") at a timing t1 as shown in FIG. 3c. Thus, the output of the AND circuit 21 is "L", so that the second switching element 25 turns on, while the first switching element 23 turns off. When the drive signal ST becomes "H", the analog gate 12 switches on. Then, the switching element 2 turns on through the comparator 10. Thereby, the current increases at the time constant of the reactor 4, as shown by a rising waveform I21 of the output current from the power source 1 in FIG. 3b. When the current value reaches the command value ITH, the switching element 2 begins repeating on and off to keep the current at the fixed command value ITH. At this time, since the second switching element 25 is on, all the current flows completely through the second switching element 25, and no current flows through the laser diodes LD1–LDn. Then, the voltage at the terminal DA or junction point "e" is only composed of the voltage drop of the second switching element 25. Thus, it is substantially zero as shown in FIG. 3e. Moreover, since the first switching element 23 is off, the voltage at the terminal DK or junction point "g" is less than the forward voltage drop of the laser diodes LD1–LDn. It is zero as shown in FIG. 3f.

When the signal PO becomes "H" at a timing T2 as shown in FIG. 3c, the second switching element 25 turns off, while the first switching element 23 turns on. Then, the laser diodes LD1–LDn are connected to the power source 1 via the reactor 4 and first switching element 23. Thus, the current circulating through the reactor 4 and second switching element 25 is switched to flow through the laser diodes LD1–LDn. The current flowing through the reactor 4 does not vary when switching the current path, so that there is no influence of the inductance of the reactor 4. Thus, as shown by the input current waveform I31 of FIG. 3d, the current rises very quickly. At this time, the voltage at the terminal DK is only composed of the voltage drop of the first switching element 23. Therefore, it is substantially zero as shown in FIG. 3f. Moreover, the voltage at the terminal DA is substantially equal to the forward voltage drop of the laser diodes LD1–LDn. It is zero as shown in FIG. 3f.

As shown in FIG. 3e, a short time of peak voltage waveform (spike) E41, E42 appears at the beginning of the timing t2 or timing t4. This is because the current rise delays due to the self-inductance L31, L32 of the lead wire 31, 32 when switching the first and second switching elements 23 and 25.

When the command signal PO is switched to "L" at a timing t3, the second switching element 25 turns on, while the first switching element 23 turns off. Thus, the voltage of the output terminal DA becomes nearly zero. While there is a back electromotive force by the self-inductance L31, L32 of the lead wire 31, 32 at the terminal DK, a circulating circuit is formed by the diode 24, power source 1, diode 3, reactor 4 and laser diodes LD1–LDn. Then, the power is regenerated to the power source 1. When the current of the laser diodes LD1–LDn becomes zero, the output terminal DK turns to an open state. Due to such factor, a short time of peak voltage waveform (spike) E51, E52 is generated as shown at the beginning of the timing t2 or timing t4 in FIG. 3e.

As mentioned above, there is no current change in the reactor 4 in switching the current path. Therefore, the inductance of the reactor 4 has no influence, so that the current rise and fall is very quick as shown in FIG. 3d. Thus, even if the signal PO has short width between the timings t4 and t5, a correct pulse current can be supplied to the laser diodes LD1–LDn.

If the signal ST becomes off at the timing t6, the switching element 2 turns off. Then, the current of the reactor 4 circulates the second switching element 25 and diode 3, thereby decreasing little by little, as shown by a waveform I22 in FIG. 3b. The decreasing current of the reactor 4 has no influence on the laser diodes LD1–LDn.

As described above, the control apparatus of the present embodiment basically operates as follows. First, it switches the signal ST to "H" and switches on and off the signal PO after the current of the reactor 4 reaches the command value ITH. Then, it switches the signal ST to "L" after switching off the signal PO. Therefore, the laser diodes LD1–LDn can be always supplied with an input current that rises and falls quickly and has a peak value equal to the command value ITH as a pulse signal. Moreover, even if the terminals DA, DK are distant from the laser diodes LD1–LDn, there are no influence of the self-inductance L31 and L32 of the lead wires 31 and 32, and quick current response is obtained. Therefore, the control apparatus of the present embodiment is effective even to a laser oscillator of large power, namely, in case the distance between the terminals DA and DK and the laser diodes LD1–LDn is long and the input current of the laser diodes LD1–LDn is large. Moreover, the control apparatus is hard to the influence of the power source voltage change, while having high responsibility in supplying current to the laser diodes LD1–LDn. Furthermore, since constant current pulses of high responsibility are obtainable in response to the command signal PO, intended correct laser output can be got from the laser diodes LD1–LDn. In addition, the reactor 4 smoothes the constant current produced by the switching element 2, so that the constant current has little ripple. Consequently, the constant power source circuit of the present embodiment is simple and less expensive compared with a conventional constant power source circuit for controlling current to a constant level.

In the first embodiment, the output current from the control apparatus rises and falls very quickly. Consequently, it is possible that an oscillating current be generated due to the inductance L31, L32, capacity of the switching element 23, 25, diode 24, 26 and laser diodes LD1–LDn, or stray capacity of the wiring or the like. Therefore, the diodes D1–Dn prevent the laser diodes LD1–LDn from reverse voltage and protect them from damage. The resistors R1–Rn have the same resistance value and balance the voltage among the laser diodes LD1–LDn at the voltage off time, thereby preventing voltage concentration to a certain laser diode LD1–LDn. When the current flows through the laser diodes LD1–LDn, even if a resistor of low resistance (e.g. about 20 ohm) is used, the power consumption is so small to the laser diode that it can be ignored. Moreover, it acts to prevent oscillation of the oscillating current. Of course, the same effects are produced if both the diodes D1–Dn and resistors R1–Rn are connected.

If the voltage of the power source 1 is higher relative to the forward voltage of the laser diodes LD1–LDn connected in series, the rising speed becomes faster. However, such voltage has nothing to do with the falling speed. On the other hand, an excessively high voltage of the power source 1 is not preferred because it increases switching loss of the switching element 2 and noise. It is preferable to set the voltage of the power source 1 nearly twice as large as that of the total forward voltage drop of the laser diodes LD1–LDn. In this case, the current increase and decrease of the reactor 4 become the same when the switching element 2 turns on and off. Thus, an average current flowing through the switching element 2 and diode 3 becomes the same, so that the current becomes uniform. Therefore, it is possible to construct the power source 1 with a high output power at low cost. The source voltage may not be exactly "twice" as large as the total forward voltage drop of the laser diodes LD1–LDn. It was confirmed by the inventors and so on that there was generated no bad influence if the source voltage was about 1.5–3 times as large.

As mentioned above, the control apparatus according to each embodiment has an optimum d.c. voltage. However, the change of the d.c. voltage dose not affect the output current waveform. Thus, even if a voltage obtained just by rectifying the commercial a.c. voltage is used, a sufficiently stable pulse current can be supplied to the laser diodes LD1–LDn regardless of the change of the voltage. Moreover, the laser diodes LD1–LDn is supplied with current by the control apparatus supplies, thereby to output laser. Such laser excites the solid state laser medium or YAG laser rod. Then, the laser is oscillated between the opposed mirrors 6 and 7, so that the laser beam 8 can be output with high efficiency. The excitation of the YAG laser with the laser diodes LD1–LDn is very effective. Moreover, it is possible to obtain the pulsed laser beam 8 by the pulse current of high responsibility as the output current from the control apparatus.

With a detailed study about the first embodiment, some phenomena are observed as described below.

Figure 4:
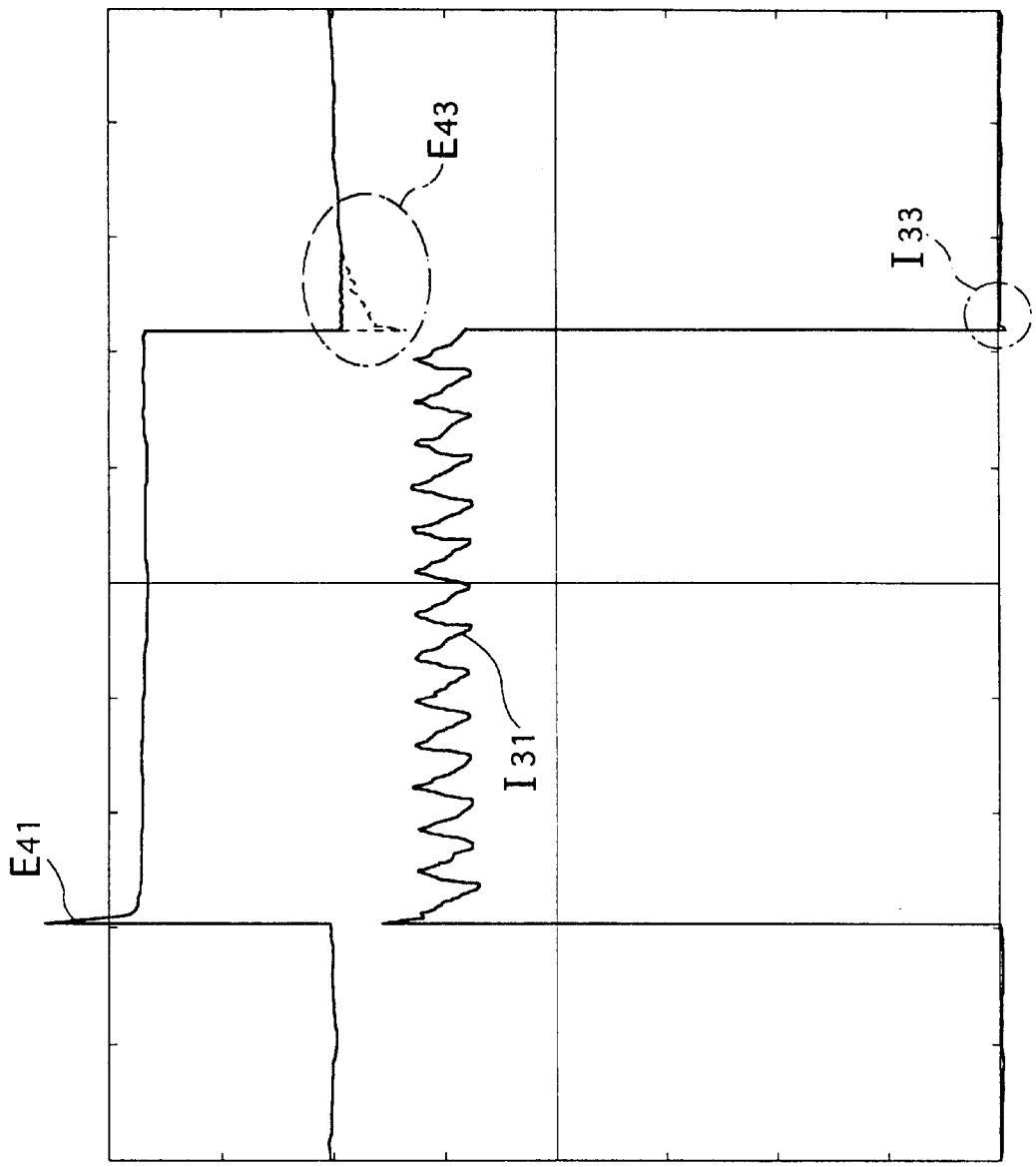
FIGS. 4a and 4b show an actual current waveform supplied to the laser diodes in the first embodiment of the invention.

FIG. 4a shows an actual waveform of an electric potential at the negative electrode of the power source and the output terminal DA in the first embodiment. FIG. 4b shows a detailed waveform of the current supplied to the laser diodes LD1–LDn in the first embodiment.

When the command signal PO is switched from "H" to "L" at the timing t3, the second switching element 25 is turned on, while the first switching element 23 is turned off. At this time, it is possible that a reverse electromotive forced or voltage be applied to the output terminal DA due to the self-inductance L31, L32 of the lead wire 31, 32. In this case, a circulating circuit is formed by the diode 24, power source 1, diode 3, reactor 4 and laser diodes LD1–LDn. Then, a spike voltage E43 as a negative voltage may be caused at the anode side of the laser diodes LD1–LDn as shown in FIG. 4b. It causes a spike current I33 as a negative voltage as shown in FIG. 4a. This is because the laser diodes LD1–LDn resonate with the self inductance L31, L32 and the junction capacity of the diodes D1–Dn.

That is, the laser diode LD1–LDn has electric characteristics as a common laser diode. Therefore, the inductance L31, L32 of the lead wire 31, 32 resonates with the junction capacity of the switching element 23, 25, diode 24, 26 and laser diodes LD1–LDn or the stray capacity between the wires. Then, a voltage is generated by such resonation, thereby to be remained as the negative voltage.

Such negative voltage is absorbed by the reversely and parallel connected diodes D1–Dn. However, it means that reverse voltage is applied to the laser diodes LD1–LDn. It is not preferred and should be prevented.

In view of the above problem, a second embodiment is provided as follows.

FIG. 5 shows a circuit at a laser diode side of a power source control apparatus according to a second embodiment of the invention. The circuit of FIG. 5 is used in place of the circuit at the laser diode side from the output terminals DA and DK of FIG. 1. FIG. 6 shows a concept view of a circuit at the laser diode side in the second embodiment. FIG. 6 corresponds to FIG. 2. FIG. 7a shows an actual waveform of an electric potential at the negative electrode of the power source and the output terminal DA in the second embodiment. FIG. 7b shows a detailed waveform of the current supplied to the laser diodes LD1–LDn in the second embodiment. FIGS. 7a and 7b corresponds to FIGS. 4a and 4b.

As shown in FIG. 5, the second embodiment of control apparatus has basically the same configuration as the first embodiment of control apparatus. The circuit additionally has the following features.

Namely, lead wires 51 and 52 are connected to the laser diodes LD1–LDn at positions near the anode and cathode thereof, respectively. A diode 41 is reversely and parallel connected between the anode and cathode of the laser diodes LD1–LDn via the lead wires 51 and 52. A series circuit of a resistor 42 and a capacitor 43 is parallel connected to the diode 41. Thus, the series circuit acting as a snubber is parallel connected to the laser diodes LD1–LDn.

The lead wires 51 and 52 are positioned near the laser diodes LD1–LDn. It means that the distance from the anode or cathode of the laser diodes LD1–LDn is short. Such distance is determined relatively in view of the lead wires 31 and 32. Therefore, it cannot be fixed unequivocally. Normally, it may be not more than 10–30 cm.

Now, the lead wires 31 and 32 are twisted as shown in FIG. 6 so as to reduce the inductances L31, L32. However, some inductance still exists. On the other hand, the series lead wires 51 and 52 are connected to such inductance reduced lead wires 31 and 32 between the anode and cathode of the laser diodes LD1–LDn. The lead wires 51 and 52 cannot be twisted or the like in general. Therefore, though the lead wires 51 and 52 are comparatively short, the self-inductances L51 and L52 exist. Lead wires of the diode 41, resistor 42 and capacitor 43 are short, so that self-inductances thereof can be ignored in general. A high-speed diode is preferred as the diode 41. A Schottky barrier diode is more preferred. In consideration of the reverse-biased diode 41, resistance and capacity of the resistor 42 and capacitor 43 are respectively set so as to prevent the resonance of the inductance L51, L52 and the stray capacity. For example, in this embodiment, the resistor 42 has a resistance of 10 Ω, and the capacitor has a capacity of 0.047 μF. Of course, other values may be used.

Unless the diode 41, resistor 42 and capacitor 43 are connected, a spike voltage E43 may arise at the anode side of the laser diodes LD1–LDn when cutting off the current ILD flowing between the terminals DA, DK, as shown in FIG. 4a.

However, such spike voltage is prevented by the diode 41 in this embodiment. In detail, when the power source 1 is switched off, the current ILD decreases. Such current ILD keeps flowing while decreasing. Then, the output terminal DA becomes negative to the output terminal DK, so that the current ILD shall flow in the reverse direction. At this time, the diode 41 starts operating, thereby acting to keep the voltage between the anode and cathode of the laser diodes LD1–LDn from becoming not less than the forward voltage of the diode 41. If the diode 41 is the Schottky barrier diode, the forward voltage is lower than junction diodes. Consequently, the reverse voltage applied to the laser diodes LD1–LDn can be lessened more, i.e. up to about 0.3–0.5V.

When the diode 41 operates, a current I flows through the inductance 51, laser diodes LD1–LDn and inductance L52. The current I continue flowing for a while even after the current ILD becomes zero. Though a spike voltage E430 arises at this time, it is nearly zero as shown in FIG. 7a. At the same time, though a spike current I330 arises and flows through the laser diodes LD1–LDn, it is also nearly zero as shown by the waveform in FIG. 7b. Just after the current I becomes zero, a voltage of the reverse-connected diode 41 changes to a positive voltage, and such positive voltage increases. However the snubber 42, 43 damps such reverse voltage to the diode 41 so as to keep the voltage at nearly zero.

As described above, in the second embodiment, the diode 41 prevents the reverse voltage applied to the laser diodes LD1–LDn, which arises at the time of cutting off the source current. Moreover, the resistor 42 and capacitor 43 serve as the snubber to prevent increase of the positive voltage applied to the diode 41, which arises at the time of cutting off the current flowing through the diode 41. Thus, the laser diodes LD1–LDn, which are delicate to the reverse voltage, can be driven safely.

FIG. 8 shows an overall circuit of a power source control apparatus according to a third embodiment of the invention. FIG. 9 shows a time chart and waveforms to explain an operation of the control apparatus of the third embodiment. Basically, the third embodiment is the same as the first embodiment. Therefore, only the different configuration from the first embodiment is described hereunder.

The third embodiment omits the series circuit of the driver 22, first switching element 23 and diode 24. Moreover, a switching element 35 substitutes the second switching element 25. Specifically, a current switching circuit 200 is composed of the AND circuit 21, inversion driver 27, switching element 35 and diode 26. Especially, the switching element 35 and diode 26 constitute a switching part 200B.

The switching element 35 is formed by MOSFET, IGBT, SIT, other transistors or the like. The switching element 35 is connected between the anode and cathode of the laser diodes LD1–LDn. A conducting resistance or forward voltage drop of the switching element 35 is set less than 1.5–2.0V, which is the forward voltage of the laser diodes LD1–LDn. Thus, the switching element 35 short-circuits all the laser diodes LD1–LDn when turned on, while forming a circulating circuit and completely blocking the current from flowing through the laser diodes LD1–LDn.

Figure 9A:
Figure 9B:
Figure 9C:
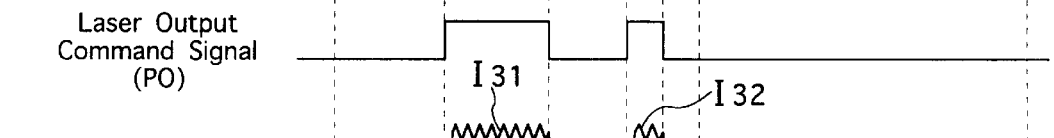
Figure 9D:
Figure 9E:
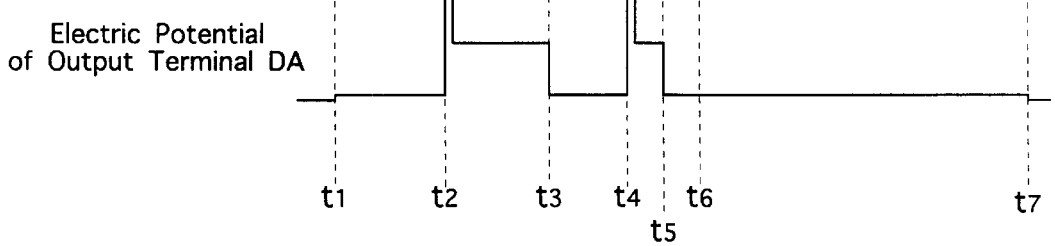

FIG. 9a shows a waveform of the drive signal ST. FIG. 9b shows a waveform of an output current from the power source. FIG. 9c shows a waveform of the command signal PO. FIG. 9d shows a waveform of a current supplied to the laser diodes LD1–LDn. FIG. 9e shows a waveform of an electric potential of the negative side of the power source and the terminal DA.

The drive signal ST shown in FIG. 9a turns on ("H") at a timing t1 and off ("L") at a timing t6, as in the case shown in FIG. 3a. When there is no laser output, the command signal PO is off ("L") at a timing t1 as shown in FIG. 9c. Thus, the output of the AND circuit 21 is "L", so that the switching element 35 turns on. As described in the first embodiment, when the drive signal ST becomes "H", the current increases at the time constant of the reactor 4, as shown by the rising waveform I21 in FIG. 9b. Then, the current is kept at the fixed command value ITH. At this time, since the switching element 35 is on, all the current flows completely through the switching element 35, and no current flows through the laser diodes LD1–LDn. Therefore, the voltage at the terminal DA or junction point "e" is only composed of the voltage drop of the switching element 35. Thus, it is less than the forward voltage drop of the laser diodes LD1–LDn, namely, substantially zero as shown in FIG. 9e.

When the signal PO becomes "H" at the timing T2 as shown in FIG. 9c, the switching element 35 turns off. Then, the laser diodes LD1–LDn are connected to the power source 1 via the reactor 4. Thus, the current circulating through the reactor 4 and switching element 35 is switched to flow through the laser diodes LD1–LDn. As in the first embodiment, the current at the reactor 4 does not vary when switching the current path, so that there is no influence of the inductance of the reactor 4. Thus, as shown by the input current waveform I31 of FIG. 9d, the current rises very quickly. The voltage at the terminal DA is substantially equal to the forward voltage drop of the laser diodes LD1–LDn.

As shown in FIG. 9e, the spike voltage E41, E42 appears at the beginning of the timing t2 or timing t4, as in the first embodiment. This is because the current rise delays due to the self-inductance L31, L32 of the lead wire 31, 32 when turning on and off the switching element 35.

When the command signal PO is switched to "L" at the timing t3, the switching element 35 turns on. Therefore, while there is a back electromotive force by the self-inductance L31, L32 of the lead wire 31, 32 at the terminal DA, a current 31a and a current 32a circulate the diode 3, reactor 4 and laser diodes LD1–LDn. Then, the currents 31a and 32a are attenuated accordingly. Thereafter, the current of the laser diodes LD1–LDn becomes zero.

As mentioned above, as in the first embodiment, even if the signal PO has short width between the timings t4 and t5, a correct pulse current can be supplied to the laser diodes LD1–LDn. Compared with the first embodiment, the current I31a, I32a is gradually attenuated by natural damping when circulating the laser diodes LD1–LDn and so on. Thus, it takes longer to attenuate the current I31a, I32a.

If the signal ST becomes off at the timing t6, the switching element 2 turns off. Then, the current of the reactor 4 circulates the switching element 35 and diode 3, thereby decreasing little by little, as shown by the waveform I22 in FIG. 9b. The decreasing current of the reactor 4 has no influence on the laser diodes LD1–LDn.

As described above, the basic operation of the control apparatus according to the third embodiment is similar to the operation of the first embodiment. Thus, the present embodiment has similar advantageous effects as the first embodiment.

In the third embodiment, a circulating circuit may be defined by the laser diodes LD1–LDn, constant current source 100 and switching part 200B that short-circuits and circulates the current from the current source 100 when there is no the command signal PO.

Moreover, a circulating circuit may be defined by the laser diodes LD1–LDn, reactor 4, switching element 2, power source 1 and switching part 200B that supply current to the switching element 2 and reactor 4 when there is no the command signal PO.

While plural laser diodes are preferably used in the first to third embodiments, the number of the laser diode depends on a required output of the laser beam 8. Namely, the number may be only one or plural as desired.

While the constant current source 100 uses the switching element 2 for current control that performs switching control to supply constant current to the laser diodes LD1–LDn, any constant current source may be used. The circuit to obtain the constant current is not limited to a specific configuration as shown in the above embodiments.

Namely, any constant current source has a reactor component constituting a circuit. However, the inventive configuration prevents current change, so that any modification of the current source is possible.

In the first and second embodiments, the switching part 200A defines a circulating circuit to supply current to the switching element 2 and reactor 4 while it does not receive the command signal PO. Moreover, the switching circuit 200 defines a circuit to supply power from the switching element 2 and reactor 4 to the laser diodes LD1–LDn when receiving the command signal PO. While the switching part 200A is composed of the first and second switching elements 23 and 25 and so on, it may be composed of another switching circuit or analog gate or the like.

Similarly, the switching part 200B of the third embodiment may be composed of other switching element or analog gate than the switching element 35 or the like.

The power source voltage for supplying power may not be exactly "twice" as large as the total forward voltage drop of the laser diodes LD1–LDn. It was confirmed by the inventors and so on that there was generated no bad influence if the source voltage was about 1.5–3 times as large. Therefore, the "twice" contains in its definition the range between 1.5–3 times.

The laser diode in each embodiment produces laser by semiconductor in the form of integrated diodes. However, the laser diode of the invention may be selected from any semiconductors producing laser and contains any semiconductors in its definition as a matter of course.

The preferred embodiments described herein are illustrative and not restrictive, the scope of the invention being indicated in the appended claims and all variations which come within the meaning of the claims are intended to be embraced therein.

What is claimed is:

1. A power source control apparatus for a laser diode, comprising:
    a laser diode;
    a constant current source connected to said laser diode; and
    a current switching circuit forming a circulating circuit to circulate a current output from said constant current source when a laser output command signal for making said laser diode output a laser beam is off, said current switching circuit forming a circuit to supply power from said constant power source to said laser diode when said laser output command signal is on.

2. A power source control apparatus according to claim 1, in which:
    said current switching circuit including a first switching element and a second switching element connected together in parallel with said laser diode;
    said current switching circuit turning on said first switching element while turning off said second switching element when said laser output command signal is off, thereby circulating a current from said constant current source within said current switching circuit through said first switching element; and
    said current switching circuit turning on said second switching element while turning off said first switching element when said laser output command signal is on, thereby outputting the current from said constant current source to said laser diode through said second switching element.

3. A power source control apparatus according to claim 1, in which:
    said current switching circuit including a switching element connected in parallel with said laser diode;
    said current switching circuit turning on said switching element when said laser output command signal is off, thereby circulating a current from said constant current source within said current switching circuit through said switching element; and
    said current switching circuit turning off said witching element when said laser output command signal is on, thereby outputting the current from said constant current source to said laser diode.

4. A power source control apparatus according to claim 1, in which said constant current source comprising:
    a reactor connected in series with said laser diode;
    a current controlling switching element connected in series with said laser diode and said reactor, said current controlling switching element performing on-off control so as to supply a constant current to said laser diode; and
    a power source supplying the power to said laser diode via said current controlling switching element and said reactor connected in series;
    said current switching circuit as said circulating circuit supplying current to said current controlling switching element and said reactor.

5. A power source control apparatus according to claim 4, in which said current controlling switching element is turned on in advance when said laser output command signal is off so that said current value of said reactor becomes equal to a command value, said laser output command signal being turned on and off thereafter, and said current controlling switching element is turned off after said laser output command signal is turned off.

6. A power source control apparatus according to claim 1, further comprising one or both of a reverse-biased diode and a resistor connected in parallel with said laser diode.

7. A power source control apparatus according to claim 6, in which a plurality of laser diodes are connected in series, one or both of said diode and said resistor is connected in parallel with each said laser diode, and said resistors have the same resistance.

8. A power source control apparatus according to claim 1, further comprising:
    a reverse-biased diode connected in parallel with said laser diode at a position near said laser diode; and
    a series circuit connected in parallel with said reverse-biased diode, said series circuit including a resistor and a capacitor.

9. A power source control apparatus according to claim 1, in which a power source voltage of said constant current source is approximately twice as large as a total value of said forward voltage drop of said laser diode.

10. A power source control apparatus according to claim 1, further comprising a solid state laser medium which is excited by the laser beam output from said laser diode thereby to generate a laser beam.

* * * * *